SEMICONDUCTOR MEMORY DEVICE

Filed Jan. 26, 1967 2 Sheets-Sheet 1

INVENTOR.
RYO IGARASHI
BY
OSTROLENK, FABER, GERB & SOFFEN
ATTORNEYS

INVENTOR.
RYO IGARASHI
BY
OSTROLENK, FABER, GERB & SOFFEN
ATTORNEYS

United States Patent Office 3,539,839
Patented Nov. 10, 1970

3,539,839

SEMICONDUCTOR MEMORY DEVICE

Ryo Igarashi, Tokyo, Japan, assignor to Nippon Electric Company Limited, Tokyo, Japan Filed Jan. 26, 1967, Ser. No. 611,868
Claims priority, application Japan, Jan. 31, 1966, 41/5,489
Int. Cl. H01l 19/00
U.S. Cl. 307—303 7 Claims

ABSTRACT OF THE DISCLOSURE

This invention deals with semiconductor elements, especially those employing semiconductor components commonly referred to as MOS transistors. Such MOS transistors are coupled in a predetermined manner to form a memory element capable of performing non-destructive readout. Such memory elements are normally comprised of first and second MOS transistors connected in a cross-coupled manner with suitable resistive components so as to form a bistable or flip-flop circuit capable of maintaining a predetermined binary memory state indefinitely. Third and fourth MOS transistors are coupled to the flip-flop circuits, and suitable potential levels are applied at their gate electrodes for performing non-destructive readout. The gate electrodes of such MOS transistors are normally comprised of a silicon oxide film which bridges two p-type regions formed in an n-type silicon substrate. By adjustment of the width and length of the silicon oxide film bridging two p-type regions, it is possbile to alter the drain current flowing between the remaining two electrodes of the transistor by significant amounts. Selecting the width and length of the silicon oxide film of the first and second transistors as to form a ratio *w/l*, which ratio is substantially greater for the first and second above mentioned MOS transistors than the *w/l* ratio for the third and fourth above mentioned MOS transistors, it is possible to increase the drain current of the write-in readout transistors significantly so as to achieve the dual objects of preventing the occurrence of destructive readout and securing a large readout signal amplitude. By adjustment of the above mentioned ratios, it is possible to completely compensate for the varying threshold voltages of MOS transistors which, though all produced in a single batch fabrication, will be found to have threshold voltages varying over a substantially large range.

This invention relates generally to memory elements for the storage of binary information, and more particularly to improvements in the operation and the circuit structure of semiconductor memory elements of the type intended for integration into memories using field-effect transistors and notably into memories for storing binary information such as are integrated into electronic computers.

In conventional memory element structures typically comprised of a bistable circuit containing at least two field-effect transistors and further comprised of two write/read field-effect transistors, the memory content was liable to be destroyed in readout. That is, a defect of conventional memory elements was that the magnitude of a readout signal from the memory element became exceedingly small in order to be assured that non-destructive readout was being performed.

An object of this invention is to eliminate this defect and to provide semiconductor memory elements with improved performance such that the impedance, in the "ON" state, of each field-effect transistor in the bistable circuit of the memory element is designed to be relatively smaller than the impedances in the "ON" state of each write/read field-effect transistor connected to the bistable circuit.

This is achieved, as will be detailed, by employing at least two kinds of field-effect transistors having at least two different ratios of gate width to gate length in an element structure.

Another object of this invention is to provide semiconductor memory elements of the kind incorporating a plurality of field-effect transistors and adapted for batch fabrication, as will be apparent from inspection of a preferred embodiment of this invention which will be subsequently described.

Still another object of this invention is to improve the yields by minimizing the possibility of destructive readout under the condition of developing a large readout output due, for example, to the deleterious effect of variation of the characteristics such as the threshold voltage of field-effect transistors in case of batch fabrication of integrated circuits.

These objects and features of this invention will become apparent in the following description taken in connection with the accompnying drawings, wherein:

FIGS. 1*a* and 1*b* are cross-sectional and top views, respectively, of a typical field-effect transistor which may be employed in semiconductor memory elements, in accordance with the instant invention.

FIG. 1*c* shows a schematic symbol for the field-effect transistors of FIGS. 1*a* and 1*b*.

The improved memory element structures according to the instant invention are basically the same as the conventional memory element structures as far as schematic circuit diagrams are concerned, but are intrinsically different in that field-effect transistors of at least two types are employed wherein these two types differ in their dimensions and characteristics. These two types of transistors are employed within a memory element structure. This modification does not operate in any way as a hindrance toward the integrated circuit realization of the memory element, as will be subsequently described.

With the semiconductor memory element according to this invention, therefore, large readout currents are available over a wide word signal amplitude range with all the merits obtained from conventional elements being completely retained.

Figure 1A:
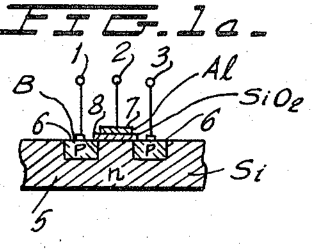
Figure 1C:
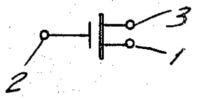
Figure 1B:
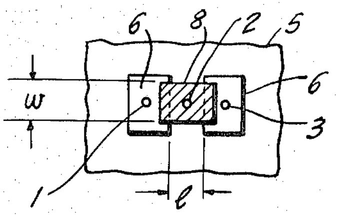

A typical field-effect transistor structure for an embodiment of the semiconductor element according to this invention is illustrated in FIG. 1*a* showing a cross-sectional side view and FIG. 1*b* showing a top view thereof.

This transistor, commonly referred to as a MOS (metal-oxide semiconductor) transistor, is produced as follows: In the first place, boron is diffused into an n-type silicon semiconductor substrate 5 to form p-type regions 6 and then, a silicon oxide film 8 is formed across the p-type regions 6 as illustrated. Finally, gate electrode 7 is evaporated onto the silicon oxide film 8 and lead wires are connected to these electrodes and to terimnals 1, 2 and 3, respectively.

With this field-effect transistor, terminals 1 and 3 are connected to the two symmetrical p-type regions 6—6. Therefore, upon applying a negative potential exceeding a threshold, as will be subsequently described, to terminal 2 with terminal 1 grounded and a negative potential applied to terminal 3, current is connected in the substrate in the direction 1→3. Alternatively current is conducted in the direction 3→1 by applying negative potentials on terminals 1 and 2, respectively, with terminal 3 grounded.

The MOS transistor with such voltage vs. current characteristics is sometimes referred to as a normally-off MOS transistor.

Incidentally, it should be understood that all of the field-effect transistors as hereinafter referred to should be normally-off MOS transistors unless otherwise specified. FIG. 1*c* illustrates a graphical or schematic symbol for the field-effect transistor of FIG. 1*a*.

Figure 2:
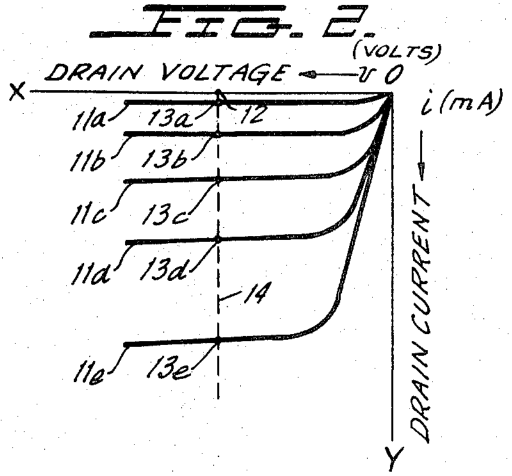
FIG. 2 is a plot showing a family of drain characteristic curves for the field-effect transistor of FIGS. 1*a* through 1*c*.

FIG. 2 shows a drain family of curves for the MOS transistor of FIG. 1, the drain current conducted between terminals 1 and 3 being plotted as a function of drain voltage applied to terminal 3 with terminal 1 grounded and the gate voltage, as a parameter, being applied to terminal 2. In FIG. 2, curve 11*a* denotes a drain characteristic corresponding to the gate voltage V*o* of the order of −5 volts at the commencement of drain current conduction between terminals 1 and 3. As the gate voltage is made more negative, curves 11*b*, 11*c*, 11*d* and 11*e* are obtained. Incidentally, the smallest gate voltage V*o* of −5 volts as the parameter is simply taken by way of example and any other value may be taken for the field-effect transistor illustrated in FIG. 1.

Figure 3:
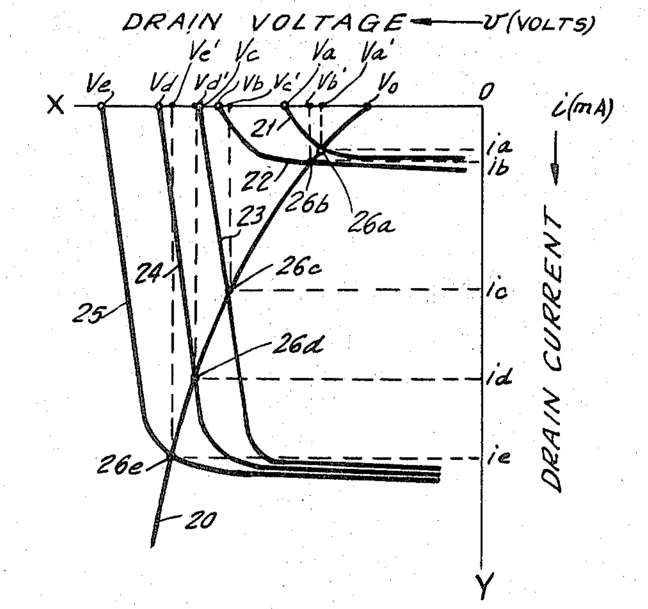
FIG. 3 is a plot showing a family of curves which illustrate the readout behavior of the semiconductor memory element of FIG. 4 which have been graphically plotted from the gate characteristics of the field-effect transistor to predict the operating points of the memory element and to further illustrate the principles of the instant invention.

Curve 20 in FIG. 3 shows the dependence of drain current on gate voltage, wherein the drain current is conducted across terminals 1 and 3. Curve 20 of FIG. 3 is derived from the points of intersection 13*a* through 13*e* of an imaginary perpendicular line 14 erected at point 12 on the abscissa and curves 11*a* through 11*e* being plotted as a function of the gate voltage. Inspection of the drain family of curves shown in FIG. 2 reveals that the drain current remains substantially unchanged irrespective of changes in the drain voltage at least in the vicinity of the intersection of line 14 with curves 11*a* through 11*e*.

Figure 4:
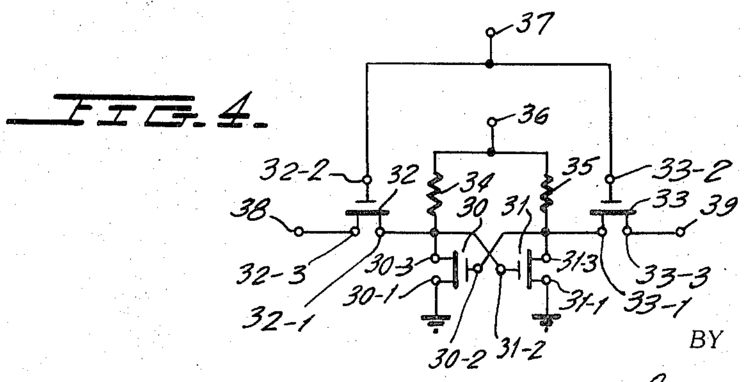
FIG. 4 is a schematic diagram illustrating a typical circuit structure for a conventional semiconductor memory element or for an embodiment of the instant invention.

FIG. 4 illustrates the circuit structure of a conventional memory element comprised of a plurality of such field-effect transistors.

Although the operating principles of a conventional memory element such as shown in FIG. 4 are well known, the following description of the readout behavior of the memory element will be helpful in providing an understanding of the principles of this invention. The fact that effect of this invention is displayed equally well in the writing operation can be easily surmised by one skilled in the art from the following description on readout operation, since a non-destructive readout characteristic is equally desirable for both readout and writing. Incidentally, the following description of the readout operation is applicable to either the conventional memory element structure illustrated in FIG. 4 or an embodiment of this invention having substantially the same circuit structure shown in FIG. 4 unless otherwise specified.

With the memory element structure of FIG. 4, a negative DC potential is applied to terminal 36 so that the bistable circuit, consisting of cross-coupled field-effect transistors 30 and 31, may assume either one of two stable states. A word signal is applied to terminal 37 causing a readout signal responsive to the word signal to be made available from either terminal 38 or 39 in readout. In writing, a change in potential in coincidence with the word signal and corresponding to writing information to be stored is applied to either terminal 38 or 39.

Now readout operation of the memory element will be described in detail to facilitate an understanding of why readout operation of the semiconductor memory element according to this invention has been improved over the conventional design.

Referring again to FIG. 4, both terminals 38 and 39 are maintained at the same DC potential, for example, −10 volts, terminal 37 is maintained at 0 volt, causing both transistors 32 and 33 to be turned "OFF" regardless of the "ON" or "OFF" state of the bistable circuit under the memory state.

When field-effect transistor 31 in the bistable circuit is "OFF," the DC potential, say −10 volts, applied to terminal 36 appears at terminal 31–3 of transistor 31 through resistor 35.

This signifies that in the circuit structure of FIG. 4 all of the resistive components of the impedances of transistors 31 and 33 across terminals 31–1, 33–1 and 31–3, 33–3 and the resistive component of the input impedance of transistor 30 at terminal 30–2 should be selected to be sufficiently higher than the resistance value of resistor 35. Stated more specifically, the resistance value of resistor 35 should be selected so as to make the potential on terminal 30–2 of transistor 30 approximately equal to that on terminal 36 when transistor 31 is "OFF." Further, the resistance of resistor 34 should be selected so that transistor 30 becomes conducting and the potential on terminal 30–3 of transistor 30 is approximately equal to ground potential when the potential on terminal 30–2 of transistor 30 is approximately equal to that on terminal 36. The above mentioned requirements should hold true for resistor 35.

Since both resistors 34 and 35 in the circuit structure of FIG. 4 should preferably be selected to have the same value, the potential on terminal 31–3 of transistor 31 is approximately equal to ground potential when transistor 30 is "OFF." According to the embodiment of this invention, for instance, both resistors 34 and 35 should be designed to have a high resistance value of the order of 1 megohm.

In readout operation with the memory element of FIG. 4, the potential on terminal 37 is varied from 0 or ground potential to a negative value in order to obtain the readout current output from terminal 38 or 39 through transistor 32 or 33, depending on the memory content of the bistable circuit.

When the potential on terminal 37 is maintained at −10 volts, for instance, in the readout period, transistor 32 initiates conduction and a readout signal is furnished to external circuitry (not shown) through terminal 38, provided transistor 30 is "ON." This signal is due to the potential drop of approximately 10 volts between terminal 30–3 (grounded) and terminal 32–3 (held at −10 volts).

However, since the potential on terminal 33–1 of transistor 33 is maintained at −10 volts as mentioned previously, transistor 33 is maintained in a nonconducting state, and no current is furnished from terminal 39 to an external circuit (not shown). This is due to the fact that terminals 31–3 and 33–3 are both at −10 volts (i.e., zero voltage drop).

The above description of operation of the memory element shown in FIG. 4 has been deliberately kept brief, due to the fact that memory elements of this type are well known to those having ordinary skill in the art, and further comment thereto is deemed unnecessary. However, detailed descriptions of such conventional memory elements can be found in copending applications Ser. No. 602,726, filed Dec. 19, 1966, and Ser. No. 570,941, filed Aug. 8, 1966, which set forth the operation of memory elements of the type shown in FIG. 4 in greater detail.

The resistive component of the impedance across terminals 30–1 and 30–3 of transistor 30 in "ON" state is found to be much smaller than the resistance of resistor 34, with the result that the relation between current across terminals 30–3 and 30–1 of transistor 30 and the potential corresponding to the word signal applied to terminal 37 may be obtained graphically with good approximation, provided that the current flowing in resistor 34 is neglected.

Therefore, given the drain characteristics of the field-effect transistor as shown in FIG. 2, all of the curves in FIG. 3 can be graphically plotted to predict the behavior of the memory element of FIG. 4.

FIG. 3 illustrates load curves as determined from the drain family of an MOS transistor in the bistable circuit as the load of a corresponding read/write MOS transistor together with the drain current of a read/write MOS transistor as a function of the gate voltage.

Curve 20 illustrates dependence of the drain current conducted between terminals 32–1 and 32–3 on the gate voltage applied across terminals 1 and 2 of transistor 32.

Curve 21 illustrates the load characteristic as transistor 30 is selected as the load of transistor 32 with the word signal voltage V*a* applied to terminal 37.

Curve 22 illustrates the load characteristic as transistor 30 is selected as the load of transistor 32 with the word signal voltage V*b* applied to terminal 37.

Curves 23 through 25 are the load characteristics as transistor 30 is selected as the load of transistor 32 with the word signal voltages V*c*, V*d*, and V*e* applied to terminal 37, respectively.

Referring to FIG. 4, the same gate voltages should be applied to the read-write transistor 32 to obtain curves 21 and 22 (used for a conventional memory element). Accordingly, curve 22 is produced by simply displacing curve 21 along the abscissa by the amount of difference between the two word signal amplitudes.

Curves 23 through 25 are available in either of the following two cases: Where the gate voltage applied to transistor 30 is made more negative than the gate voltage for curves 21 and 22 or where the impedance in the "ON" state of field-effect transistor 30 is designed to be much smaller than that of the read/write field-effect transistor 32. Since the gate voltage is maintained at a constant value, both curves 24 and 25 an be obtained by displacing curve 23 along the abscissa in the left-hand direction in the figure by an amount equal to the difference between any two word signal amplitudes in succession.

To apply a gate voltage more negative than the gate voltage corresponding to curve 21 or 22 to transistor 30 contained in the memory element should strictly be discouraged for the reason that the DC potential applied to terminal 36 must be increased accordingly.

The most significant highlight of this invention is to obtain curves 23 through 25 by adopting two types of field-effect transistors differing in the ratio of gate width to gate length, rather than employing the above mentioned undesirable approach of applying a more negative gate voltage upon gate 30–2 of transistor 30.

Any one of the intersecting points 26*a* and 26*b* denotes the operating point of the conventional memory element with the field-effect transistor 30 turned "ON." In this case, currents $i_a$ and $i_b$ are obtained from terminal 38, respectively, for operating points at 26*a* and 26*b*, the corresponding voltages across terminals 3 and 1 being V*a*–V*a'* and V*b*–V*b'*.

The voltage across terminals 30–3 and 30–1 of the field-effect transistor 30 is applied, as it is, to the gate electrode of field-effect transistor 31. Care must be taken generally in this case lest transistor 31 should become conducting and destructive readout should occur.

In order that readout may succeed, therefore, any one of V*a*–V*a'* and V*b*–V*b'* should not exceed a predetermined value, say —5 volts, as the potential on terminal 37 is caused to vary from 0 to V*a* or V*b*.

This invention intends to provide novel memory element structures capable of meeting two conditions at the same time: Preventing the occurrence of destructive readout and the securing of large readout signal amplitudes.

Figure 5:
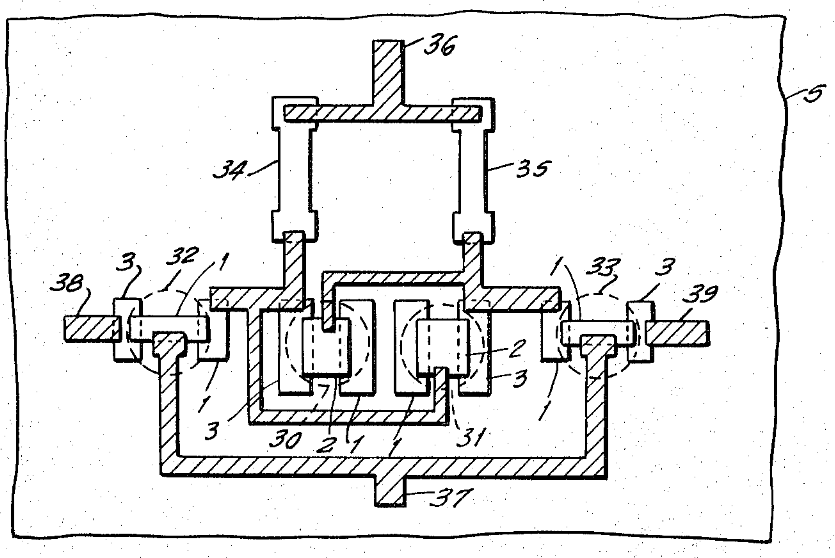
FIG. 5 shows a top plan view of an integrated circuit layout for an embodiment of the semiconductor memory element designed in accordance with the principles of the instant invention and which may schematically be represented by the same schematic diagram as shown in FIG. 4.

These objectives are achieved by use of field-effect transistors 30 and 31 in the bistable circuit of the memory element structure of FIG. 5, each having the load characteristics as shown by curves 23 through 25, and by reducing the magnitude of the potential across electrodes 3 and 1 of each of the transistors. Accordingly, V*c*–V*c'* or V*d*–V*d'* can be maintained comparatively small as compared with the conventional memory element of FIG. 4, even if a voltage V*c* or V*d*, more negative than V*a* or V*b*, is applied to terminal 37.

The foregoing description is applicable, as it is, to readout operation with transistor 31 turned "ON." Therefore, the memory element according to this invention is capable of furnishing a large readout current output to either terminal 38 or 39 through field-effect transistor 32 or 33, depending on the "ON" or "OFF" state of the bistable circuit.

FIG. 5 illustrates a layout of an integrated circuit structure for the embodiment of this invention, in which the circuit components shown in FIG. 4 have been fabricated in the surface of a semiconductor substrate 5.

Each of the shaded portions in FIG. 5 denotes an evaporated metallic film corresponding to a parts-connecting conductor and each of resistors 34 and 35 is a thin film resistor deposited upon the substrate 5 in any suitable manner. The grounding conductor for connection to terminal 1 of each of the field-effect transistors 30 and 31 has been omitted in FIG. 5 for simplicity. Obviously, conventional techniques may be employed to electrically insulate the conductive film from specified areas of the substrate, when necessary.

By varying gate width *w* and gate length *l* of the shaded area in FIG. 1*b* with the thickness of the silicon oxide film maintained constant, the drain current is caused to vary in proportion to the ratio of *w/l*, provided the drain and gate voltages are kept constant. Stated more specifically, increasing the ratio *w/l* decreases the "ON" state impedance across terminals 1 and 3 of a transistor, while decreasing the ratio *w/l* increases the "ON" state impedance.

As will be obvious from inspection of the embodiment of this invention shown in FIG. 5, the gate width *w* of each of transistors 30 and 31 is designed to be larger than the gate width *w* of each of the transistors 32 and 33, whereas the gate length *l* of each of the transistors 30 and 31 is designed to be smaller than the gate length *l* of each of the transistors 32 and 33. In other words, the impedance in "ON" state of each of transistors 30 and 31 is designed to be smaller than the impedance in "ON" state of each of transistors 32 and 33.

To visualize the merits of this invention clearly, a graph of FIG. 6 has been developed for samples of the memory element shown in FIG. 5, wherein the ratio *A/B* (referred to as the specific ratio hereinafter;

A=gate width to gate length ratio for each of the MOS transistors 30 and 31;

B=gate width to gate length ratio for each of 32 and 33)

and maximum allowable readout current in milliamperes (non-destructive readout current) capable of being furnished to terminal 38 or 39 are respectively taken as the abscissa and the ordinate. Theory predicts that there should be linear relations for changes in maximum allowable current I with specific ratio *A/B*.

Figure 6:
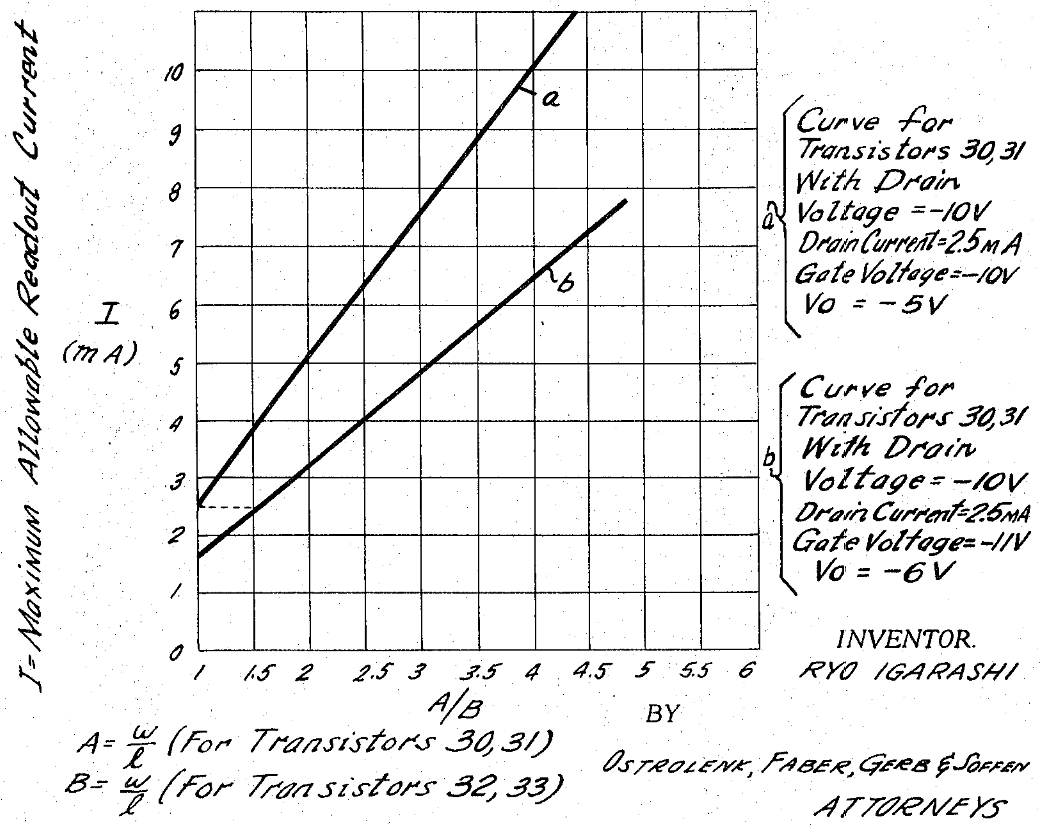
FIG. 6 is a plot showing curves which illustrate the significant improvements in readout current output which can be obtained through utilization of the principles of the instant invention.

The characteristics of each of the field-effect transistors 30 and 31 for "curve *a*" of FIG. 6 are assumed as follows: Threshold voltage V*o*=—5 volts, drain current for drain voltage of —10 volts and gate voltage of —10 volts=2.5 ma.

The characteristics of each of the transistors 30 and 31 for "curve *b*" of FIG. 6 are assumed as follows: Threshold voltage V*o*=—6 volts, drain current for drain voltage of —10 volts and gate voltage of —11 volts= 2.5 ma.

In short, the difference between curves *a* and *b* is mainly due to the difference in the threshold voltage V*o* of transistors 30 and 31, —5 volts for curve *a* and —6 volts for curve *b*.

Whereas it may be intended, in the manufacture of a number of field-effect transistors to have such samples exhibit equal threshold voltages of —5 volts, as a practical matter actual values of the products will vary over a range, for example, from —4 volts to —6 volts. Accordingly, the maximum readout current of a memory element with the specific ratio ($A/B$) of 1.5 comprising field-effect transistors in the bistable circuit, each having the threshold of —6 volts can be made approximately equal to that of a memory element with the specific ratio of 1 comprising field-effect transistors in the bistable circuit each having the threshold of —5 volts, as will be evident from FIG. 6. It will be further evident from FIG. 6 that the maximum allowable current increases markedly in proportion to the specific ratio $A/B$.

The upper limit of the specific ratio $A/B$ should, however, be restricted by the writing speed. It is considered to be most appropriate to determine the value of the specific ratio between 1.5 and 5 for optimum semiconductor memory structures.

The essence of the foregoing description may be summed up as follows: The range of voltage to be applied to terminal 37 for non-destructive readout with improved memory elements has been markedly widened and large readout currents are available as compared with conventional memory elements.

While the principles of this invention have been described in connection with the typical embodiment of this invention, this description is simply made by way of example and not as a limitation on the scope of this invention.

For instance, the equivalent memory element as the embodiment of this invention may be realized by use of the normally-off n-channel MOS transistors in place of the normally-off p-channel MOS transistors, provided that the polarity of each of the DC voltage and the word signal be reversed. The principles of this invention could be realized by combining a plurality of field-effect transistors with different V–I characteristics which could be realized simply by controlling the thickness of the silicon oxide film as shown in FIG. 1.

Further, a plurality of field-effect transistors with the same V–I characteristics may be used to construct a similar memory element, provided a field-effect transistor of other kind be connected in shunt with each of the field-effect transistors 30 and 31.

It can, therefore, be seen that the instant invention provides a novel means for achieving the objectives of assuring non-destructive readout of a memory element, as well as assuring significantly high readout current signals through the use of designing the respective width and length of the silicon oxide film for the bistable circuit transistors to be significantly different from the width and length of the silicon oxide film in the read/write transistors of a memory element so as to adjust the respective ratios of impedances accordingly.

Although this invention has been described with respect to its preferred embodiments, it should be understood that many variations and modifications will now be obvious to those skilled in the art, and it is preferred, therefore, that the scope of the invention be limited not by the specific disclosure herein, but only by the appended claims.

What is claimed is:

1. A memory element of the non-destructive readout type comprising:

first and second field-effect transistors being cross-coupled to form a bistable circuit;

third and fourth field-effect transistors being coupled to said bistable circuit to effect write-in and readout operations;

each of said field-effect transistors being comprised of a p-type silicon substrate having two n-type regions diffused into said substrate a spaced distance apart;

a metal oxide film deposited upon said substrate electrically coupling said two n-type regions;

first, second and third electrodes being respectively coupled to said two n-type regions and said metal oxide film;

said metal oxide film having a substantially rectilinear configuration; the width of said film in each of said first and second transistors being substantially different from the width of said film in said third and fourth transistors;

the spacing between said n-type regions in said first and second transistors differing substantially from the spacing between said n-type regions in said third and fourth transistors;

said metal oxide film in each transistor being of a length substantially equal to said spacing to electrically bridge said n-type regions.

2. The memory element of claim 1 wherein the ratio of width to length ($w/l$) of said film for said first and second transistors is greater than the ratio ($w/l$) for said third and fourth transistors.

3. The memory element of claim 1 wherein the ratio of width to length ($w/l$) of said film for said first and second transistors is 1.5 to 5.0 times as large as the ratio of ($w/l$) for said third and fourth transistors.

4. A memory element of the non-destructive readout type comprising:

first and second field-effect transistors being cross-coupled to form a bistable circuit;

third and fourth field-effect transistors being coupled to said bistable circuit to effect write-in and readout operations;

each of said field-effect transistors being comprised of a p-type silicon substrate having two n-type regions diffused into said substrate a spaced distance apart;

a metal oxide film deposited upon said substrate electrically coupling said two n-type regions;

first, second and third electrodes being respectively coupled to said two n-type regions and said metal oxide film;

said metal oxide film having a substantially rectilinear configuration; the width of said film in each of said first and second transistors being substantially different from the width of said film in said third and fourth transistors;

the spacing between said n-type regions in said first and second transistors differing substantially from the spacing between said p-type regions in said third and fourth transistors;

said metal oxide film in each transistor being of a length substantially equal to said spacing to electrically bridge said p-type regions.

5. The memory element of claim 4 wherein the ratio of width to length ($w/l$) of said film for said first and second transistors is greater than the ratio ($w/l$) for said third and fourth transistors.

6. The memory element of claim 4 wherein the ratio of width to length ($w/l$) of said film for said first and second transistors is 1.5 to 5.0 times as large as the ratio of ($w/l$) for said third and fourth transistors.

7. A memory element for use in electronic computers and the like and being capable of performing non-destructive readout operations comprising;

first, second, third and fourth field-effect transistors;

each of said transistors having drain, source and gate electrodes;

said first and second transistors being cross-coupled in the following manner to form a bistable circuit;

bias means;

first and second resistors having first ends connected to the source electrodes of said first and second transistors;

a first conductor coupling the source electrode of said first transistor to the gate of said second transistor;

a second conductor coupling the source electrode of said second transistor to the gate of said first transistor;

the drain electrodes of said first and second transistors being coupled in common, said third and fourth transistors being coupled to said bistable circuit in the following manner to effect readout and write-in operations;

the drain electrodes of said third and fourth transistors being respectively coupled to the source electrodes of said first and second transistors;

the gates of said third and fourth transistors being connected in common;

the resistivity of each of said third and fourth transistors being between said drain and source electrodes being within the range of from 1.5 to 5.0 times as large as the resistivity of said first and second transistors.

References Cited

UNITED STATES PATENTS

| | | | |
|---|---|---|---|
| 3,275,908 | 9/1966 | Grosvalet | 317—235 |
| 3,275,996 | 9/1966 | Burns | 340—173 |
| 3,321,680 | 5/1967 | Arndt et al. | 317—234 |
| 3,379,941 | 4/1968 | Blanluet | 317—235 |
| 3,191,061 | 6/1965 | Weimer | 317—235 X |
| 3,418,493 | 12/1968 | Uzunoglu et al. | 307—238 |
| 3,421,026 | 1/1969 | Stopper | 307—289 |
| 3,449,594 | 6/1969 | Gibson et al. | 307—251 |

OTHER REFERENCES

"Non Destructive Readout Memory Cell" by P. Pleshko, p. 1142, IBM Technical Bulletin, vol. 8, No. 8, January 1966, 307-304.

JERRY D. CRAIG, Primary Examiner

U.S. Cl. X.R.

307—238, 279; 317—235; 340—173